(12) United States Patent
Su et al.

(10) Patent No.: US 8,999,766 B2
(45) Date of Patent: Apr. 7, 2015

(54) ESD/ANTENNA DIODES FOR THROUGH-SILICON VIAS

(71) Applicant: Synopsys, Inc., Mountain View, CA (US)

(72) Inventors: Qing Su, Sunnyvale, CA (US); Min Ni, Santa Clara, CA (US); Zongwu Tang, Pleasanton, CA (US); Jamil Kawa, Campbell, CA (US); James D. Sproch, Monte Sereno, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/133,369

(22) Filed: Dec. 18, 2013

(65) Prior Publication Data

US 2014/0109027 A1 Apr. 17, 2014

Related U.S. Application Data

(62) Division of application No. 13/567,922, filed on Aug. 6, 2012, now Pat. No. 8,877,638, which is a division of application No. 12/605,102, filed on Oct. 23, 2009, now Pat. No. 8,264,065.

(51) Int. Cl.
*H01L 21/82* (2006.01)
*G06F 17/50* (2006.01)
*H01L 27/02* (2006.01)
*H01L 23/48* (2006.01)
(Continued)

(52) U.S. Cl.
CPC ........ *G06F 17/5068* (2013.01); *H01L 27/0207* (2013.01); *H01L 23/481* (2013.01); *H01L 23/60* (2013.01); *H01L 23/62* (2013.01); *H01L 27/0255* (2013.01); *H01L 2225/06541* (2013.01); *H01L 2924/0002* (2013.01)

(58) Field of Classification Search
CPC ................... H01L 27/0207; H01L 2225/06541
USPC .................................................. 438/129, 667
See application file for complete search history.

(56) References Cited

U.S. PATENT DOCUMENTS

| 4,734,752 A | 3/1988 | Liu et al. |
|---|---|---|
| 5,817,577 A | 10/1998 | Ko |

(Continued)

FOREIGN PATENT DOCUMENTS

| CN | 101371332 A | 2/2009 |
|---|---|---|
| JP | 402137269 | 5/1990 |

(Continued)

OTHER PUBLICATIONS

Fang S. et al., "Thin-Oxide Damage from Gate Charging During Plasma Processing," IEEE Electron Device Letters, 13(5) May 1992, pp. 288-290.

(Continued)

*Primary Examiner* — Telly Green
*Assistant Examiner* — Toniae Thomas
(74) *Attorney, Agent, or Firm* — Haynes Beffel & Wolfeld LLP; Warren S. Wolfeld

(57) ABSTRACT

Roughly described, an antenna diode is formed at least partially within the exclusion zone around a TSV, and is connected to the TSV by way of a metal 1 layer conductor at the same time that the TSV is connected to either the gate poly or a diffusion region of one or more transistors placed outside the exclusion zone.

24 Claims, 12 Drawing Sheets

(51) Int. Cl.
 *H01L 23/60* (2006.01)
 *H01L 23/62* (2006.01)

(56) References Cited

U.S. PATENT DOCUMENTS

| | | | |
|---|---|---|---|
| 5,998,299 | A | 12/1999 | Krishnan |
| 6,657,835 | B2 | 12/2003 | Ker et al. |
| 7,338,853 | B2 | 3/2008 | Kao et al. |
| 7,541,677 | B2 | 6/2009 | Kawano |
| 7,563,714 | B2 | 7/2009 | Erturk et al. |
| 7,633,167 | B2 | 12/2009 | Kawano et al. |
| 7,709,381 | B2 | 5/2010 | Han et al. |
| 7,795,735 | B2 | 9/2010 | Hsu et al. |
| 7,799,678 | B2 | 9/2010 | Kropewnicki et al. |
| 7,816,227 | B2 | 10/2010 | Chen et al. |
| 7,846,837 | B2 | 12/2010 | Kuo |
| 7,906,363 | B2 | 3/2011 | Koyanagi |
| 7,960,282 | B2 | 6/2011 | Yelehanka et al. |
| 7,968,460 | B2 | 6/2011 | Kirby et al. |
| 8,232,625 | B2 | 7/2012 | Voldman |
| 8,560,982 | B2 * | 10/2013 | Rahman .......... 438/667 |
| 2006/0255465 | A1 | 11/2006 | Kishiro |
| 2007/0190692 | A1 | 8/2007 | Erturk et al. |
| 2007/0262350 | A1 | 11/2007 | Nagase |
| 2008/0179678 | A1 | 7/2008 | Dyer et al. |
| 2009/0108464 | A1 | 4/2009 | Uchiyama |
| 2009/0152602 | A1 | 6/2009 | Akiyama |
| 2009/0278230 | A1 | 11/2009 | Komuro |
| 2009/0289324 | A1 | 11/2009 | Goodlin et al. |
| 2009/0321796 | A1 | 12/2009 | Inohara |
| 2010/0032811 | A1 | 2/2010 | Ding et al. |
| 2010/0130002 | A1 | 5/2010 | Dao et al. |
| 2010/0164062 | A1 | 7/2010 | Wang et al. |
| 2010/0193954 | A1 | 8/2010 | Liu et al. |
| 2010/0224876 | A1 | 9/2010 | Zhu |
| 2010/0252934 | A1 | 10/2010 | Law et al. |
| 2010/0270597 | A1 * | 10/2010 | Sproch et al. .......... 257/255 |
| 2011/0001249 | A1 | 1/2011 | Law et al. |
| 2011/0080184 | A1 | 4/2011 | Wu et al. |
| 2011/0084365 | A1 | 4/2011 | Law et al. |
| 2011/0089572 | A1 | 4/2011 | Tezcan et al. |
| 2014/0173545 | A1 * | 6/2014 | Sproch et al. .......... 716/119 |

FOREIGN PATENT DOCUMENTS

| | | |
|---|---|---|
| JP | 2009-111061 A | 5/2009 |
| WO | 2007137969 A1 | 12/2007 |

OTHER PUBLICATIONS

Shin H. et al., "Thin Oxide Damage by Plasma Etching and Ashing Processes," Proc. IEEE Int'l Reliability Phys. Symp., 1992, pp. 37-41.

Shin H. et al., "Plasma Etching Charge-Up Damage to Thin Oxides," Solid State Technology, Aug. 1993, pp. 29-36.

Gabriel C. et al., "How Plasma Etching Damages Thin Gate Oxides," Solid State Technology, Jun. 1992 vol. 34(6), pp. 81-87.

Watanabe T. et al., "Dielectric Breakdown of Gate Insulator Due to Reactive Ion Etching," Solid State Technology, Apr. 1984, vol. 26(4) pp. 263-266.

IP.com, "ESD Protection of Through Silicon Via Signals Utilizing Temporary Backside Metalization", IP.com No. 000181056 (Mar. 29, 2009).

Schaper L et al., "Integrated System Development for 3-D VLSI," IEEE, 978-1-4244-3497-8/08, pp. 145-148.

Shen, L-C et al., "A Clamped Through Silicon Via (TSV) Interconnection for Stacked Chip Bonding Using Metal Cap on Pad and Metal Column Forming in Via," IEEE 2008 Electronic Components and Technology Conference, 978-1-4244-2231-9/08, pp. 544-549.

Vandevelde B et al., "Thermo-mechanics of 3D-wafer level and 3D stacked IC packaging technologies," IEEE, 9th Int. Conf. on Thermal, Mechanical and Multiphysics Simulation and Experiments in Micro-Electronics and Micro-Systems, EuroSimE 2008, 978-1-4244-21282/08, pp. 1-7.

International Search Report mailed Jun. 9, 2010 in PCT/US2009/062686.

JP 2012-535182—Office Action dated Jul. 31, 2013, 6 pages (with English translation).

CN 200980162252.1—Office Action dated Apr. 28, 2014, 29 pages.

TW 099136137—Office Action and Searc Report dated Jun. 24, 2014, 22 pages.

* cited by examiner

ESD/ANTENNA DIODES FOR THROUGH-SILICON VIAS

CROSS-REFERENCE TO OTHER APPLICATIONS

This application is a Divisional of U.S. application Ser. No. 13/567,922, filed 6 Aug. 2013, by Qing Su, Min Ni, Zongwu Tang, Jamil Kawa and James D. Sproch, entitled "ESD/ANTENNA DIODES FOR THROUGH-SILICON VIAS,", which application is a Divisional of U.S. application Ser. No. 12/605,102, filed 23 Oct. 2009, by Qing Su, Min Ni, Zongwu Tang, Jamil Kawa and James D. Sproch, entitled "ESD/ANTENNA DIODES FOR THROUGH-SILICON VIAS,", which application are incorporated herein by reference in their entirety.

BACKGROUND

The present invention relates to methods and structures for addressing ESD and antenna effects experienced by devices in the presence of through-silicon vias.

Finished integrated circuit devices typically include diffusions and implant regions in the body of a silicon wafer. Above the silicon itself is a gate dielectric layer (such as an oxide), and above that a gate layer in which transistor gates are patterned. The gate layer is usually polysilicon, but in some fabrication processes it can be metal. Above that are several layers of metal interconnects, each separated from the previous layer by a dielectric. Where interconnections are required from one layer to another, an opening is formed through the intervening dielectric layer and filled with a conductive material. There are many variations on this structure, but the one just described is common.

The interconnections between layers are referred to as 'vias' if they interconnect two metal interconnect layers, or 'contacts' if they connect the first metal interconnect layer to the silicon or gate layers. For simplicity of discussion, no distinction is made herein between 'contacts' and 'vias', and the two terms are used interchangeably herein.

The first metal interconnect layer above the wafer itself is referred to as "metal 1", or M1 for short. During fabrication, this layer is formed over the underlying dielectric and then patterned to form individual conductors. The next dielectric layer is then formed above M1, vias are opened as required in this layer, and then a Metal 2 (M2) layer is formed and patterned. This process continues on up through M3, M4, and so on to the highest metal layer.

During the process of fabricating an integrated circuit, it often happens that M1 conductors are connected through a contact to the gate poly of a MOSFET. During reactive-ion etching process steps, the M1 conductors pick up charge from the plasma and can build up a high enough voltage relative to the substrate as to break down the thin dielectric that separates the gate poly from the substrate. This destructive phenomenon is known as "plasma induced gate oxide damage", or more colloquially the "antenna effect". The antenna effect usually is not a problem after fabrication, because by that time every M1 conductor has at least one driver connected to it. A driver includes a source or drain diffusion or implant, which forms a diode with the larger body of silicon in which it resides. Whether forward or reverse biased, this diode either conducts or non-destructively breaks down, before the voltage on the M1 conductor reaches the magnitude at which the gate dielectric breaks down.

But since conductive paths are often routed in such a way that they jump among different metal layers, the connection of a transistor gate terminal to a driver often is not completed until higher layers of metal are formed on the wafer. There will be a period of time during fabrication, therefore, that M1 conductors are connected to gate poly and nowhere connected to a driver. During these time periods, the gate dielectrics are subject to a risk of breakdown due to charge buildup on the M1 conductor to which it is connected.

There is a related source of plasma induced gate oxide damage which occurs during fabrication, referred to herein as "antenna effect electrostatic discharge (ESD) damage." This problem occurs because during fabrication some M1 conductors are connected through contacts to the drain diffusion or implant of N-channel transistors, thereby providing another path for charge built up on the conductors to break down gate dielectrics as it couples to the gate poly.

Both of the above phenomena occur during fabrication, and arise because the conductors pick up charge from the etching plasma or from other sources. They are to be distinguished from a third source of charge-induced gate dielectric damage, referred to herein as "external ESD". External ESD occurs from exposure to an external source of static discharge like a human touch. External ESD usually occurs after fabrication, during handling of completed devices. The problem of external ESD is addressed by including large ESD protection circuits on the chip and connecting them to all the I/O pads.

At least three different solutions have been used to address the problem of destructive charge buildup during fabrication. In one solution, the routing of the circuit is changed so that only a small segment of M1 is directly connected to the gate and the balance of the net is routed through higher levels of metal. The length of M1 material connected to gate poly is then extremely short during the fabrication process, and does not become long until a higher layer of metal is formed which also makes the final connection to a driver. Since the ability of a conductor to pick up deleterious charge from the etching plasma is greatly reduced when the length of the conductor is small, the risk of antenna effect gate dielectric damage is minimized by this technique. On the other hand, this solution places a heavy burden on routing software.

A second solution is similar to the first in that transistor gates are connected directly to the highest layer of metal. It differs in that another via nearby each gate is provided as well to connect back down to M1 where more standard routing can take place. Like the first solution the conductor length in M1 connected to the gate is extremely short until the highest layer of metal is applied, which is the same step in which the final connection is made to a driver. But the impact on routing software is minimized since nearly the entire length of each interconnect that would take place in M1 absent antenna considerations, remains in M1. On the other hand, the requirement for two vias for every gate undesirably occupies valuable chip area.

In yet a third solution, extra diodes (called "antenna diodes") are formed adjacent each input and connected to the transistor gates in the M1 level. The diodes are formed by implanting an $N^+$ region in $P^-$ substrate or a $P^+$ region in an N-substrate, for example. These diodes are reverse biased during normal circuit operation, but during fabrication they will protect the gate dielectrics by breaking down non-destructively before the voltage on the M1 conductor reaches the magnitude at which the gate dielectrics break down. Antenna diodes are typically placed close to the transistor gates which they protect. On some chips the antenna diodes are added near only those transistors that are at risk for antenna effect damage, for example near only those transistors to which a long M1 conductor is connected that does not also connect in M1 to a driver. On other chips they are added near every transistor. Since one diode can protect more than one transistor if they are all nearby and have interconnected gates, it is typical that only one antenna diode is provided for each input of a cell. For example, in a CMOS inverter cell, only one antenna diode will be provided for protecting the gate dielectrics of both the N-channel and P-channel transistors. Often two entire libraries of cells are provided, one which includes an antenna diode for each input, and one which includes no antenna diodes. For a particular design, the chip designer typically chooses to use one library or the other in its entirety throughout the design, thereby in effect choosing for the entire design whether to include or not include antenna diodes throughout.

In yet a fourth solution, the router "drops in" antenna diodes in long routes.

The use of antenna diodes as in the third and fourth solutions above, can avoid the problems of the first and second solutions, but they undesirably occupy valuable chip area. They can also increase the capacitance experienced at the cell inputs. When used, therefore, these diodes are typically kept as small as permitted (in terms of chip area occupied) given the fabrication process. In particular, in plan view, the M1 contact area for the diode cathode is equal to the minimum contact size permitted by the fabrication process, and the $N^+$ region below it has an area equal to the minimum required by the fabrication process to enclose the minimum contact area. As an example, the contact might be 0.18 microns square, and the $N^+$ region might be 0.38 microns square, allowing a 0.1 micron margin on all four sides of the contact.

ESD protection circuits, provided on I/O pads to protect against external ESD events, also usually incorporate diodes. These diodes however are much larger than antenna diodes, since they are designed to dissipate much larger and much more sudden charge buildups. They should not be confused with antenna diodes, which are designed more to bleed off lower levels of charge accumulating more gradually.

Separately, as integrated circuit scaling becomes increasingly difficult with each technology node, three-dimensional (3D) integration technologies have emerged as viable alternatives to achieve the requisite integration densities. 3D integration improves system performance and allows heterogeneous integration of circuit blocks. Many 3D integration techniques include vertical interconnects using through-silicon vias (TSVs). A TSV is a via that passes through the entire body of the chip connecting M1 on the top surface of the chip to a metal connection on the bottom surface of the chip. TSVs have very high aspect ratios, and therefore exhibit many of the same risks of charge accumulation during fabrication that M1 conductors exhibit during fabrication. The problem can actually be worse for TSVs, because many of them are intended to connect to contacts on the next stacked chip without the standard ESD protection afforded by an intervening I/O structure. Those TSVs which are connected on the chip to gate poly therefore will not be connected to a driver until stacking, thereby exposing the gate dielectric to damage both from charge pickup throughout the entire process of fabricating the chip, as well as from external ESD events during post-fabrication handling.

One solution that has been proposed for TSVs is the formation of a temporary layer of metal covering the entire underside of the wafer, formed as the last step of wafer fabrication. Such a metallization shorts together all the TSVs, thereby widely distributing any charge picked up during post-fabrication handling and before the chip is stacked. The connections between the TSVs and the back-side metallization are then removed before final assembly of the stack. However, TSVs are typically formed relatively early in the chip fabrication process, prior to the M1 layer. Since the back-side metallization is not applied until the last step of wafer fabrication, it does not protect gate dielectrics from charge accumulation during all the etching steps that occur during the patterning of all the layers from M1 up. Other than this solution, antenna diodes can be used as described above, but at the cost of chip area as described above.

SUMMARY

A need therefore exists for a robust solution to the problem of charge pickup by TSVs during the integrated circuit fabrication process. Better chip yields, and denser, and more powerful circuits, components and systems may result.

It is known that TSVs are complex geometries consisting of various metals with widely varying mechanical properties. During the manufacturing process, these geometries undergo thermal cycling that introduces thermo-mechanical stresses in the surrounding silicon. The TSVs also introduce thermal mismatch stresses in the active silicon and affect the carrier mobility. Carrier mobility is affected differently in different positions near the TSV, resulting in mobility variations which can significantly affect the performance of transistors that are laid out near the TSV. A typical response to these stresses by workers in the field is to define a zone around them, within which no transistors are to be placed.

In particular, the prior art generally prescribes a "keep-away zone", or "exclusion zone", within which transistor placement is to be avoided. For example, in Vandevelde, et al., "Thermo-mechanics of 3D-Wafer Level and 3D Stacked IC Packaging Technologies" 9th Int. Conf. on Therm., Mech. and Multi-Physics Simulations and Exper. in Microelec. and Micro-Systems, (EuroSimE), 2008, pp. 1-7, incorporated herein by reference, the keep-away zone is prescribed separately for P-channel and N-channel transistors, and separately for transistor current direction positions parallel and transverse to the [110] crystal direction. The exclusion zone appears to be defined in Vandevelde as a circle centered at the center of the TSV, and having a radius equal to the largest distance (over all angular positions) from the center of the TSV at which the mobility change exceeds 5% in magnitude. For the particular materials studied by Vandevelde et. al., the exclusion zone for P-channel transistors was found to extend to a distance from the TSV which ranges from about 0.5 microns to about 5 microns, depending on the doping level of the silicon and the radius of the TSV. None of the tests reported by in Vandevelde found an exclusion region for P-channel transistors that extended less than 0.5 microns from the TSV. For N-channel transistors the exclusion zone was found to extend to a distance from the TSV which ranges from about 1 micron to about 1.5 microns. Vandevelde would allow disposing N-channel transistors immediately adjacent to the TSV for copper TSVs having a radius of 2.5 microns or less. But for CMOS processes, which typically include both P-channel and N-channel transistors in close proximity to each other, the exclusion zone radius for the more sensitive P-channel transistors defines the exclusion radius for all transistors. Therefore, the smallest exclusion zone found by Vandevelde for CMOS is a circle centered at the center of the TSV and extending to 0.5 microns away from the TSV boundary. In many other situations, the exclusion is much larger, often on the order of 5 microns.

Applicants have recognized that the TSV exclusion zone can be used to advantage in the problem of charge pickup by TSVs during the integrated circuit fabrication process. In particular, roughly described, one or more antenna diodes can be formed within the exclusion zone surrounding a TSV, and connected to the TSV in M1. As this region is otherwise unused, protection is achieved without any impact on circuit density. Moreover, such an antenna diode can be formed without any additional masks or fabrication process steps.

Roughly described, an aspect of the invention involves placing an antenna diode at least partially within the exclusion zone around a TSV, and connecting it to the TSV by way of a metal 1 layer conductor at the same time that the TSV is connected to either the gate poly or a diffusion region of one or more transistors placed outside the exclusion zone.

In another aspect, an antenna diode is disposed at least partially within 0.5 microns of TSV.

In another aspect, an antenna diode surrounds the TSV laterally, with the diode extending vertically into the substrate or well.

In another aspect, a vertically oriented antenna diode has at least a portion located laterally between the TSV and the nearest transistor diffusion region.

In another aspect, an antenna diode connected to a TSV is larger than any antenna diode that is not connected to a TSV, or at least larger than the average area of all the antenna diodes on the chip.

In another aspect, a method is provided for laying out a circuit design, for use in forming a lithographic mask set for use in fabricating an integrated circuit on a substrate, the method being for use by a computer system having a processor and memory, the method including the steps of identifying a position on the integrated circuit at which a TSV is to be placed; determining an exclusion zone surrounding the TSV laterally; laying out a transistor having a diffusion region in the substrate, a gate conductor and a gate dielectric separating the gate conductor from the substrate, the diffusion region being disposed outside the exclusion zone; laying out a first region in the substrate and at least partially within the exclusion zone, the first region being doped to exhibit a first conductivity type, the substrate in at least a second region adjacent to the first region being doped to exhibit a second conductivity type opposite the first conductivity type; and laying out an M1 layer conductor interconnecting the TSV, the first region, and either the diffusion region or the gate conductor.

In another aspect of the invention, an integrated circuit is fabricated through the use of the steps of providing a semiconductor substrate; forming a TSV passing through the substrate, the substrate having an exclusion zone laterally adjacent to the TSV; forming first, second and third diffusion regions simultaneously in the substrate, the first diffusion region being disposed at least partially within the exclusion zone and the second and third diffusion regions being disposed outside the exclusion zone, the first, second and third diffusion regions being doped to exhibit a first conductivity type, the substrate in at least a region adjacent to the first region being doped to exhibit a second conductivity type opposite the first conductivity type; forming a gate dielectric over the substrate and a gate conductor over the gate dielectric, the second and third diffusion regions, the gate conductor and the gate dielectric all forming parts of a transistor; and forming an M1 layer conductor interconnecting the TSV, the first diffusion region, and either the second diffusion region or the gate conductor.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
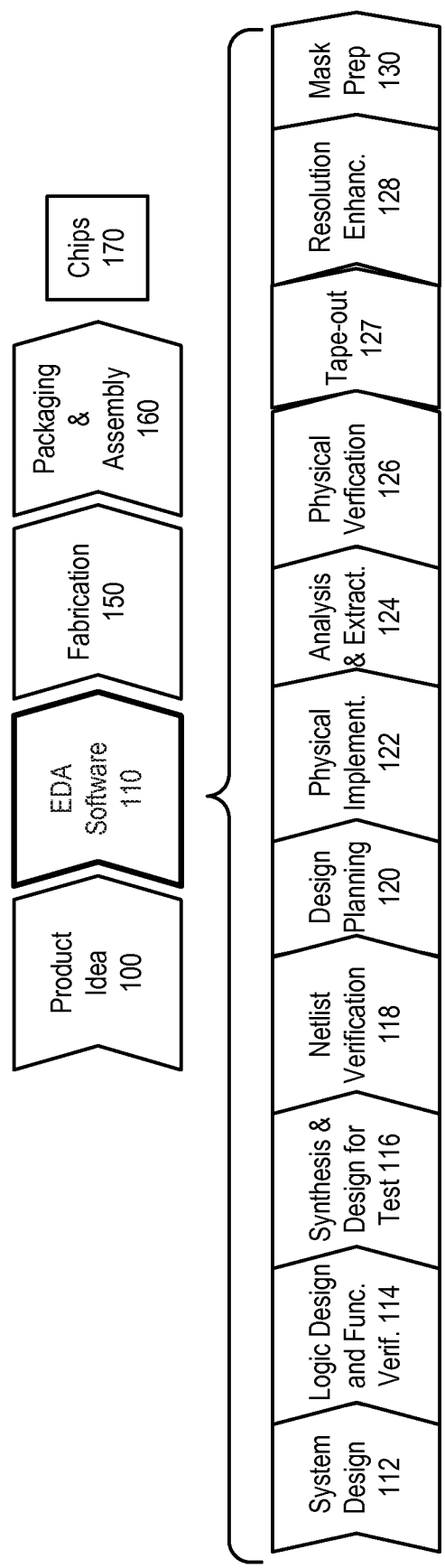
FIG. 1 shows a simplified representation of an illustrative digital integrated circuit design flow.

FIG. 1 shows a simplified representation of an illustrative digital integrated circuit design flow. At a high level, the process starts with the product idea (step 100) and is realized in an EDA (Electronic Design Automation) software design process (step 110). When the design is finalized, it can be taped-out (step 127). At some point after tape out, the fabrication process (step 150) and packaging and assembly processes (step 160) occur resulting, ultimately, in finished integrated circuit chips (result 170).

The EDA software design process (step 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and Custom Designer products.

Physical implementation (step 122): The placement (positioning of circuit elements) and routing (connection of the same) occurs at this step. Example EDA software products from Synopsys, Inc. that can be used at this step include the Astro and IC Compiler products.

Analysis and extraction (step 124): At this step, the circuit function is verified at a transistor level, this in turn permits what-if refinement. Example EDA software products from Synopsys, Inc. that can be used at this step include AstroRail, PrimeRail, PrimeTime, and Star-RCXT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product.

Tape-out (step 127): This step provides the "tape-out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides mask-making-ready "tape-out" data for production of masks for lithographic use to produce finished chips. Example EDA software products from Synopsys, Inc. that can be used at this step include the CATS(R) family of products.

Figure 2:
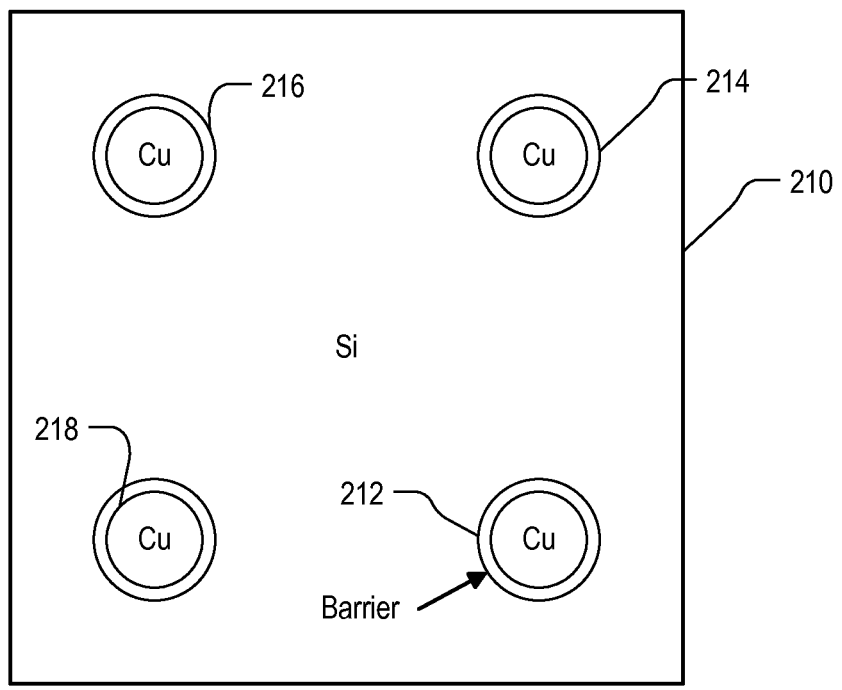
FIG. 2 is a plan view of a simplified structure of a region of a silicon substrate containing four example TSVs.

FIG. 2 is a plan view of a simplified structure of a region of a silicon substrate 210 containing four example TSVs 212, 214, 216 and 218. In one embodiment the four TSVs are all located on a single chip, and in another embodiment the image of FIG. 2 represents a portion of a wafer prior to dicing, and after dicing one or more of the TSVs 212, 214, 216 and 218 will be located on a different chip from one or more of the others. Each TSV in FIG. 2 is represented in the plan view by a circular copper via surrounded by an SiO2 barrier dielectric, although other materials can be used in other embodiments for both the conductor and the barrier dielectric. During the process of fabricating a silicon wafer with TSV's, the structure undergoes cooling from a high temperature such as 250 degrees C., down to room temperature (–25 degrees C.). As the structure cools, both the silicon and copper materials shrink, but the copper shrinks more than the silicon. This causes tensile stress in the silicon in a direction normal to the TSV circumference (i.e. radially), which in turn causes compressive stress in the silicon in a direction tangential to the TSV circumference. The magnitudes of the stresses fall off with increasing distance away from the edge of the TSV.

Figure 3:
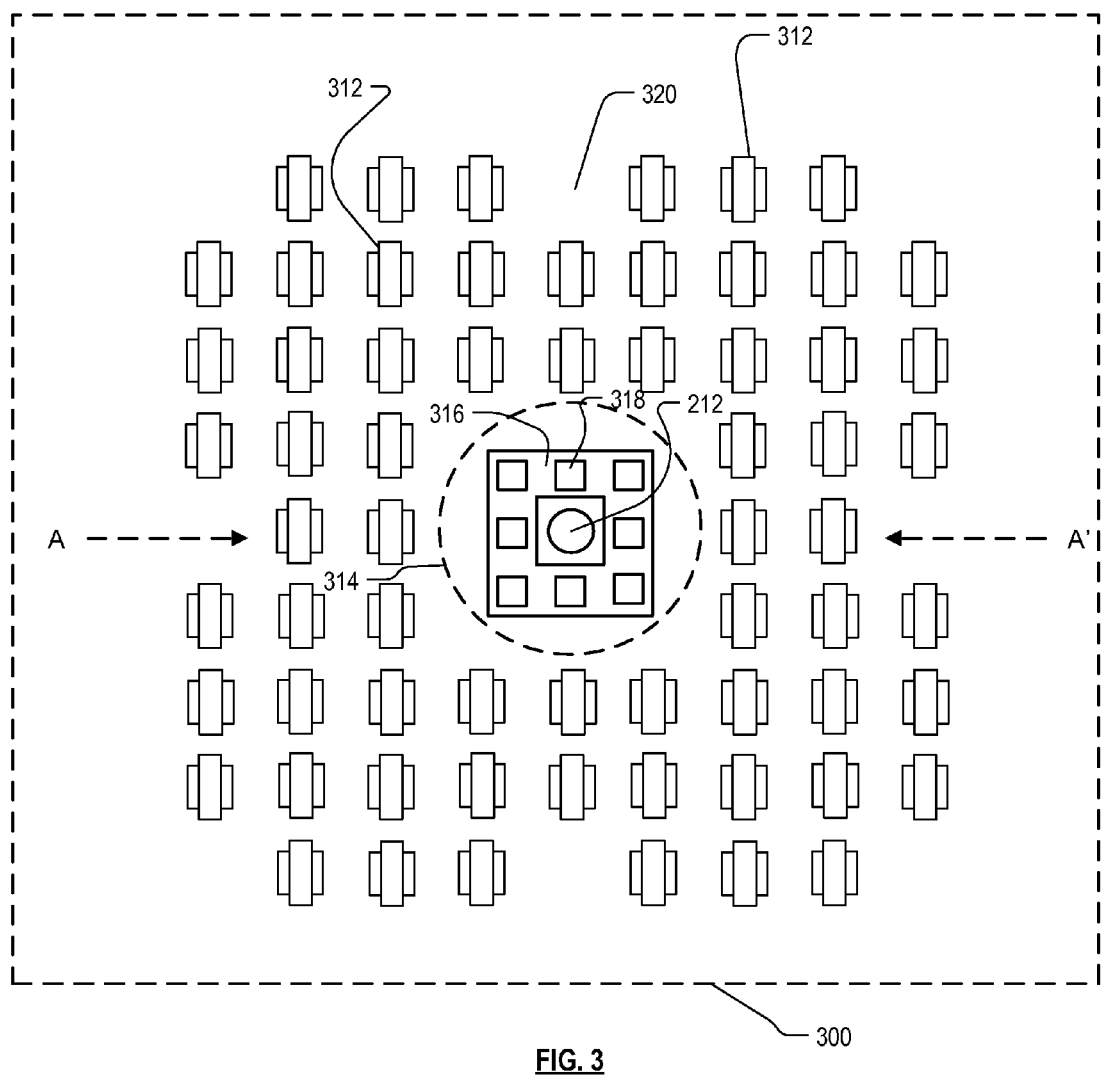
FIG. 3 is a plan view of an example region of an integrated circuit substrate showing one of the TSVs of FIG. 2 and transistors in a substrate.

FIG. 3 is a plan view of an example region 300 of an integrated circuit substrate showing one of the TSVs 212 and a large number of transistors 312 in a substrate 320. Similar structures (not shown) exist around others of the TSVs 214, 216 and 218. As used herein, the term "region" refers to a 3-dimensional volume. Additionally, as used herein, the term "vertical" refers to the direction perpendicular to the wafer major surface, and the term "lateral" refers to any direction parallel with the wafer major surface. Furthermore, structures such as transistors, which include parts physically within a substrate and parts above the substrate, are referred to herein as being either "in" or "on" the substrate with no difference in meaning intended.

The TSV 212 is shown in FIG. 3 as a single circle, but it will be appreciated that there is also a barrier dielectric (not shown) separating it electrically from the body of the silicon wafer. For clarity of illustration, none of the metal layers are visible in FIG. 3. Also, the transistors 312 are shown in a regular pattern in FIG. 3. Such regularity might be typical of a highly repetitive circuit like a memory array, but would be atypical of a logic circuit, where transistor placement would appear much more random. Also, in FIG. 3 all the diffusion regions have the same width and each pair of diffusion regions is used for only a single transistor. In many layouts, diffusion regions are often shared among more than one transistor, and can have different widths. However, the regular layout of FIG. 3 will serve for the present discussion. The term "diffusion region" is used herein to describe transistor drain and source regions, even though they might in some processes be formed by implantation, or by some other means, rather than diffusion.

Also shown in FIG. 3 is a circle 314 representing an exclusion zone within which the layout software has placed no part of any source or drain region of any transistor. As used herein, the "exclusion zone" is a region that is established by layout/placement software, such as IC Compiler or Custom Designer, both available from Synopsys, Inc. The exclusion zone size might be either of fixed size in the software or configurable in response to input from the layout engineer. The "exclusion zone" is a real zone that is avoided by the layout software for purposes of placing active devices such as transistors. It may have a constant size around all TSVs on the chip, or in a different embodiment it might vary in size among different TSVs. The software might define different exclusion zones for transistors of different conductivity types, but if it does, then as the term is used herein the "exclusion zone" is the intersection of exclusion zones for different kinds of devices. That is, it is a zone within which the layout software places no part of any transistor source or drain regions. It will be appreciated that the "exclusion zone" as defined herein is real and can be determined from (among other sources) the software configuration used by the layout software when laying out a particular integrated circuit chip.

Also shown in FIG. 3 is an $N^+$ region 316 surrounding the TSV 212 but within the exclusion zone 314. Vias 318 are shown above the region 316, which pass through any dielectric layers between the silicon and the M1 layer. A conductor in M1 (not shown in FIG. 3) connects the TSV 212 to the $N^+$ region 316 through each of the vias 318.

Figure 4:
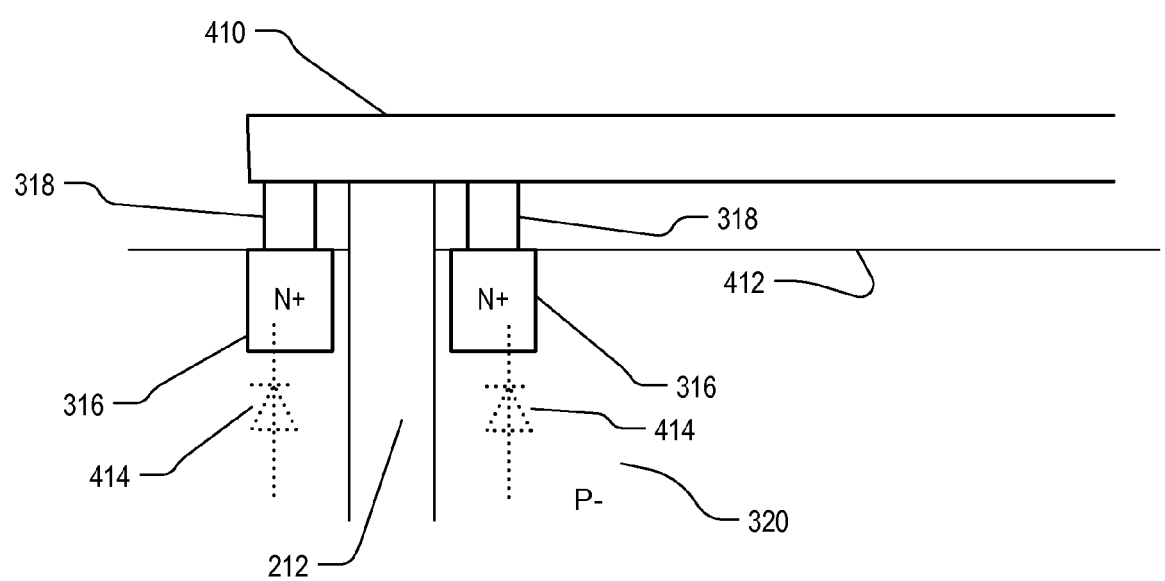
FIG. 4 is a cross-sectional view of an exclusion zone of FIG. 3, taken along sight lines A-A' in FIG. 3.

FIG. 4 is a cross-sectional view of the exclusion zone 314, taken along sight lines A-A' in FIG. 3. As with all drawing figures herein, FIG. 4 is not drawn to scale. FIG. 4 shows the TSV 212 passing vertically through the substrate 320, which in the region shown in the embodiment of FIG. 4 is doped $P^-$. Again, the barrier dielectric is present but not shown in FIG. 4. The top surface of silicon is indicated as 412. The $N^-$ ring 316 surrounding the TSV 212 is also shown, as are two of the vias 318. Note that as used herein, a "ring" need not be circular. FIG. 4 also shows a conductor 410 in M1, connecting the TSV 212 to other circuitry as required to implement the designed functionality. It is also connected through the vias 318 to the $N^+$ region 316.

The $N^+$ region 316 forms a diode 414 (shown symbolically in FIG. 4 in dotted lines) with the larger body 320 of $P^-$ doped silicon in which it is disposed. The $N^+$ region 316 is the cathode of the diode 414, and it is connected in M1 to the TSV. The $P^-$ substrate may be grounded, but that is not absolutely necessary since its large volume permits it to absorb a large amount of electrostatic charge without significantly varying its voltage. During fabrication, the $N^+$ region 316 is formed prior to the formation of the M1 conductor 410 and the formation of conductive material in the vias 318. The connection of the TSV 212 to the diode 414 therefore occurs during the formation of the M1 layer, which is the same process step in which the TSV 212 may be connected to a transistor source, drain or gate conductor. Thus the diode 414 acts as an antenna diode, protecting the gate dielectrics of any transistor to which the TSV 212 might be connected, from any charge that might build up in the TSV 212 during the fabrication process after the TSV 212 is connected to any such transistors. If the unwanted charge build-up increases the voltage on TSV 212 relative to the substrate 320, then the diode 414 will be reverse biased and will break down before the gate dielectrics break down. If the charge build-up pushes the TSV 212 voltage negative, then it will forward bias the diode 414. The diode 414 then will conduct after the voltage difference exceeds the forward biased diode voltage drop, which is also below the voltage magnitude at which the gate dielectrics break down.

During normal operation of the integrated circuit, the voltage on the TSV 212 varies as required, but keeps the diode 414 reverse-biased. The voltage also does not exceed the reverse-bias breakdown voltage of the diode 414, nor does it fall so low relative to the substrate 320 as to forward bias the diode 414. Thus while the diode 414 adds capacitance and power consumption to the circuit, it does not otherwise affect its operation. The $N^+$ region 316 and the $P^-$ region 320 are doped so as to achieve a reverse-bias breakdown voltage that exceeds the normal operating voltages of the circuit, but which is smaller than the voltage at which the gate dielectrics break down. Illustratively, for a typical logic circuit in which power supply voltages are +1.5V and 0V, the diode 414 might be designed to have a reverse-bias breakdown voltage of, for example, 3.5V.

It will be appreciated that the $N^-$ region 316 in the embodiment of FIGS. 3 and 4 is located entirely within the exclusion zone 314 surrounding the TSV 212. This feature is advantageous, since the area within the exclusion zone 314 is unused anyway. The antenna diode for TSV 212 therefore occupies no chip area which would otherwise be used for active devices. It therefore has no negative impact on circuit density. Additionally, the $N^+$ region 316 is formed in the same process step in which other $N^+$ regions are formed in the wafer. Similarly, the vias 318 are formed in the same process step in which other such vias are formed, and the M1 connection to both the TSV 212 and the $N^+$ region 316 is formed in the same process step that other M1 conductors are formed. Thus the implementation of the antenna diode for TSV 212 also has no negative impact on fabrication processes.

It will also be appreciated that the point in the $N^+$ region 316 in the embodiment of FIGS. 3 and 4 that is nearest to the TSV 212, is located closer to the TSV 212 than is the nearest point in the diffusion regions of all the transistors on the substrate. In fact the $N^+$ region 316 in the embodiment of FIGS. 3 and 4 is located in its entirety, closer to the TSV 212 than is the nearest diffusion region of all the transistors on the substrate.

Figure 5:
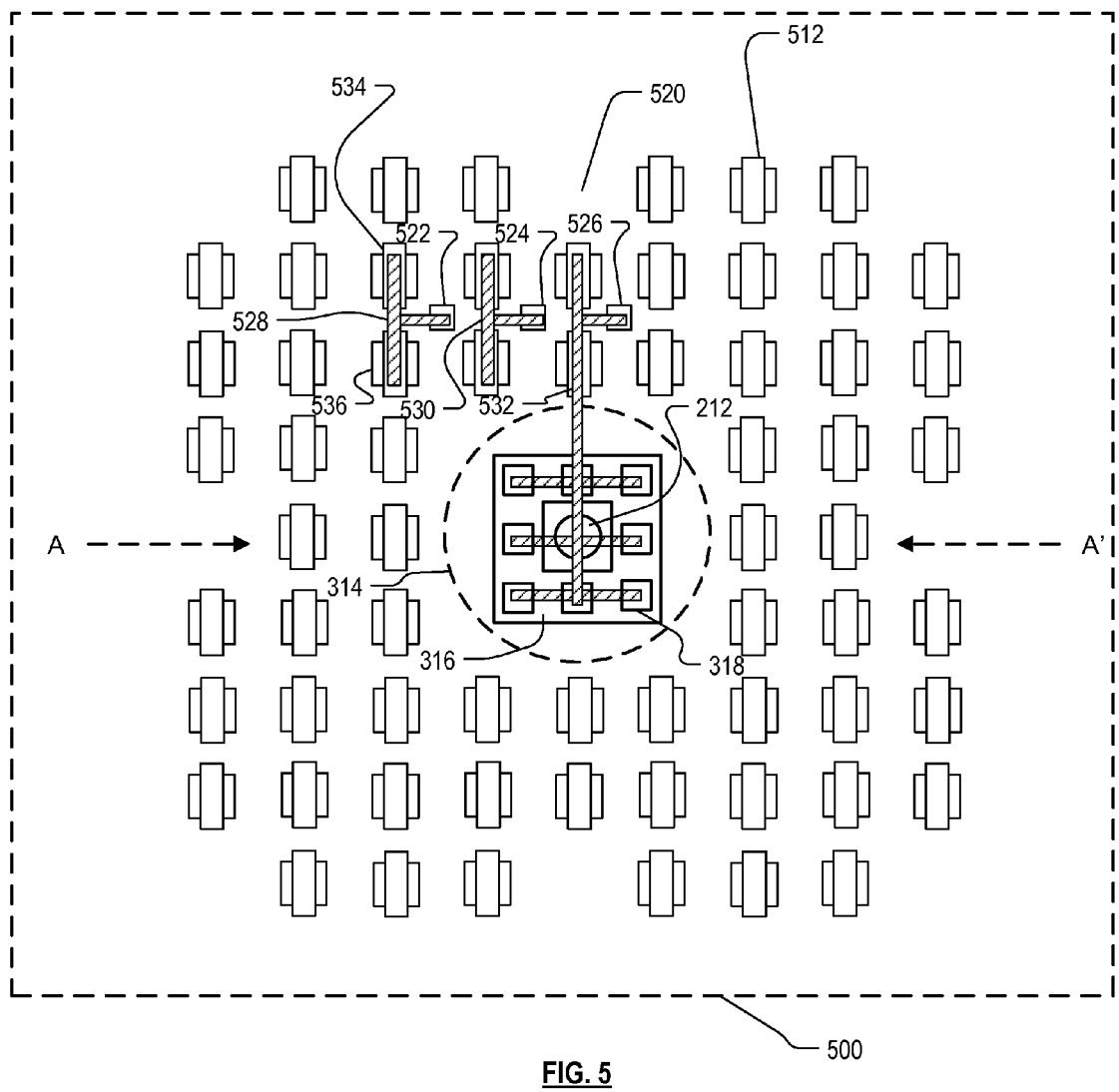
FIG. 5 is a plan view of an example region of an integrated circuit substrate in another embodiment, showing a TSV and transistors in a substrate.

FIG. 5 is a plan view of an example region 500 of an integrated circuit substrate in another embodiment, showing the TSV 212 and a large number of transistors 512 in a substrate 520. FIG. 5 is similar to FIG. 3, except that some conventional antenna diodes 522, 524 and 526 are shown, as well as some of the M1 layer conductors. Specifically, conductor 528 interconnects antenna diode 522 with the gates of transistors 534 and 536; conductor 530 interconnects antenna diode 524 with the gates of two other unnumbered transistors, and conductor 532 interconnects TSV 212, the $N^+$ region 316, the antenna diode 526, and the gates of two other unnumbered transistors. As previously explained, $N^+$ region 316 forms its own antenna diode, but this diode, which is connected to a TSV, is much larger in chip area than either of antenna diodes 522 and 524, which are not connected to TSVs. As previously mentioned, antenna diodes typically used for protecting transistor gate dielectrics are made as small as possible given the fabrication process, whereas the antenna diode formed by $N^+$ region 316 can be made much larger because it does not occupy chip area that would otherwise be usable for active circuitry. In fact the antenna diode formed by $N^+$ region 316 in the embodiment of FIG. 5 is larger in chip area than each antenna diode in the chip which is not connected to a TSV.

It is noted that some chips might include one or some antenna diodes that are not connected to a TSV, and which for some reason are larger than the antenna diode formed by $N^-$ region 316. Even then, however, the antenna diode formed by $N^-$ region 316 is still larger than the average area occupied by all the antenna diodes in the chip which are not connected to a TSV.

There are many other variations for implementing diode 414. In the embodiment of FIGS. 3 and 4, the $N^+$ region 316 is square and completely surrounds the TSV 212. In other embodiments, the $N^+$ region can be rounded, even extending co-extensively with the exclusion region 314. The inner boundary of $N^+$ region 316 can also have any desired shape, and in one embodiment can extend all the way to the barrier dielectric surrounding the TSV 212. In other embodiments, the $N^+$ region need not completely encircle the TSV 212. The $N^+$ region can encircle it partially, or almost completely except for a gap. Alternatively, the $N^+$ region can be made up of one or more individual $N^+$ regions, each of which is much smaller in area than the region 316 as shown in FIG. 3. In this last variation, the $N^+$ regions would form separate antenna diodes all connected in parallel, but together would have similar properties to the single larger antenna diode. Additionally, in one embodiment the $N^+$ region(s) may be restricted to lie within 0.5 microns of the TSV boundary, regardless of the size of any exclusion zone.

Similarly, the interconnection of the TSV 212 to the one or more N⁻ region(s) can be a square in M1, fully covering both the TSV 212 and the entire area within the outer boundary of N⁺ region 316 as shown in FIG. 3, or it can be something less than a full square. For example, it can consist of one or more narrow conductors connecting the TSV 212 to the N⁻ region (s). The only caveat is that it form a conductive path from the TSV to each of the N⁺ regions which are to participate in protecting gate dielectrics from charge build-up in the TSV 212 during fabrication.

Still other variations are possible. For example, whereas limiting the lateral extent of the N⁺ region 316 to remain within the exclusion zone 314 avoids any encroachment on chip area otherwise usable for active devices, there is no reason why the N⁺ region cannot be made to extend outside the exclusion zone 314 if the impact on circuit density is acceptable. In particular, this may be desirable if the diode 414 is to also protect against externally delivered ESD, where a diode limited in area to the exclusion zone 314 might not be large enough. In this case, the N⁺ region 316 may be made much larger than the exclusion zone 314. As long as the N⁺ region includes at least a portion inside the exclusion zone, advantages are obtained not previously thought possible.

In yet another variation, the circuit operates at negative rather than positive voltages relative to the substrate. In this case the TSV 212 during normal operation would be expected to carry a voltage between 0V and, for example, −5V. To accommodate this, the antenna diode is formed in the opposite direction, with the anode instead of the cathode connected to the TSV 212. The bulk silicon may be doped N⁻, and the region 316 doped P⁺. In general, therefore, it can be said that the region 316 and the bulk silicon region 320 within which it is formed have "opposite conductivity types". It will be appreciated that all levels of N-type doping (whether they be called N, N⁻ or N⁺) all have a conductivity type that is the opposite of that of all levels of P-type doping (whether they be called P, P⁻ or P⁺). As used herein, N⁻ and N⁺ doping levels are considered merely special cases of "N" doping, and P⁻ and P⁺ doping levels are considered merely special cases of "P" doping.

Design and Layout Processes

Figure 6:
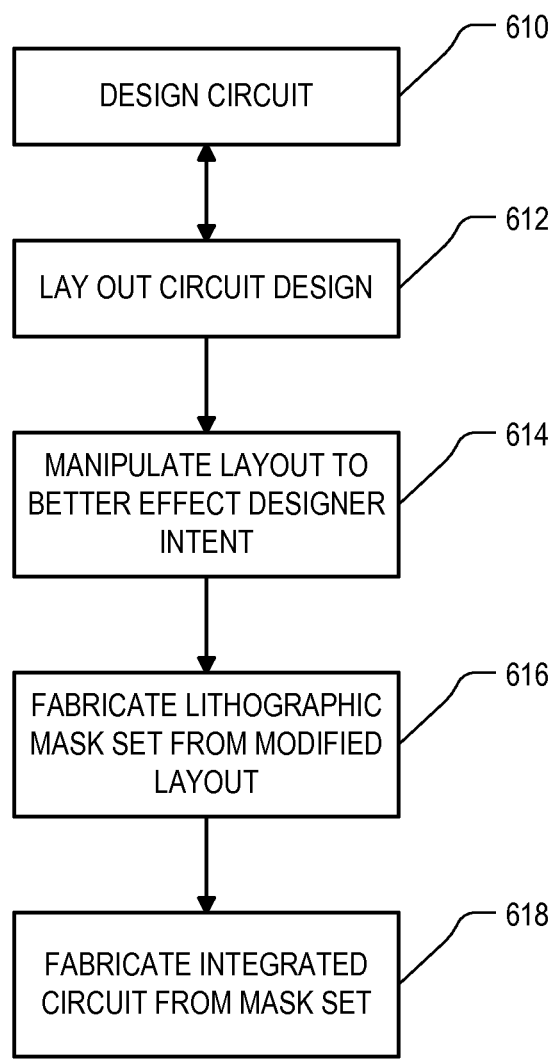
FIG. 6 is a flow chart illustrating aspects of the design flow pertinent to some of the embodiments discussed herein.

FIG. 6 is a flow chart illustrating aspects of the design flow pertinent to some of the embodiments discussed herein. As with all flowcharts and fabrication step sequences described herein, it will be appreciated that many of the steps can be combined, performed in parallel or performed in a different sequence without affecting the functions achieved. In some cases a re-arrangement of steps will achieve the same results only if certain other changes are made as well, and in other cases a re-arrangement of steps will achieve the same results only if certain conditions are satisfied.

Referring to FIG. 6, in step 610 a circuit is designed. Step 610 corresponds roughly to steps 100 and steps 112-118 of FIG. 1. As used herein, the term "circuit design" refers to the gate or transistor level design, after compilation from a Verilog or VHDL design representation or similar, and before layout. The circuit design is represented after step 610 in a netlist file. In step 612, corresponding roughly to steps 120-126 of FIG. 1, the circuit design is laid out. The layout is represented in a geometry file which defines, among other things, all the shapes to be formed on each mask that will be used to expose the wafer during fabrication. The geometry file can have any of several standard formats, such as GDSII, OASIS, CREF, and so on, or it can have a non-standard format. The file describes the layout of the circuit design in the form of a mask definition for each of the masks to be generated. Each mask definition defines a plurality of polygons. At the end of step 612 in the present embodiment, no resolution enhancement (RET) has yet been performed. Thus the layout geometries resulting from step 612 are in a sense idealized, since they do not yet take into account the imperfections of lithographic printing using optical wavelengths comparable or larger in size than the size of the geometries in the layout. For example, rectangles are rectangular, and are not yet pre-corrected for diffractive effects.

In step 614, corresponding roughly to step 128, the layout is revised through a number of steps to better effect designer intent. The intent of the designer is discerned from the idealized layout shapes (such as intended drive current discerned from channel widths), and modifications are made to better achieve that intent in the ultimate integrated circuit. Optical proximity correction occurs in this step, as does the addition of shape engineering bumps or protrusions as described hereinafter. The revised layout is once again represented in a geometry file, typically using one of the geometry file formats above.

In step 616, a lithographic mask set is created based on the modified layout from step 614. The method for making the masks is not a significant aspect of the present invention, so any mask making technique can be used, either known today or developed in the future. As an example, masks can be printed using techniques set forth in U.S. Pat. Nos. 6,096,458; 6,057,063; 5,246,800; 5,472,814; and 5,702,847, all incorporated by referenced herein for their teachings of mask printing techniques.

After the mask set is made, in step 618, integrated circuits are fabricated using them.

Figure 7:
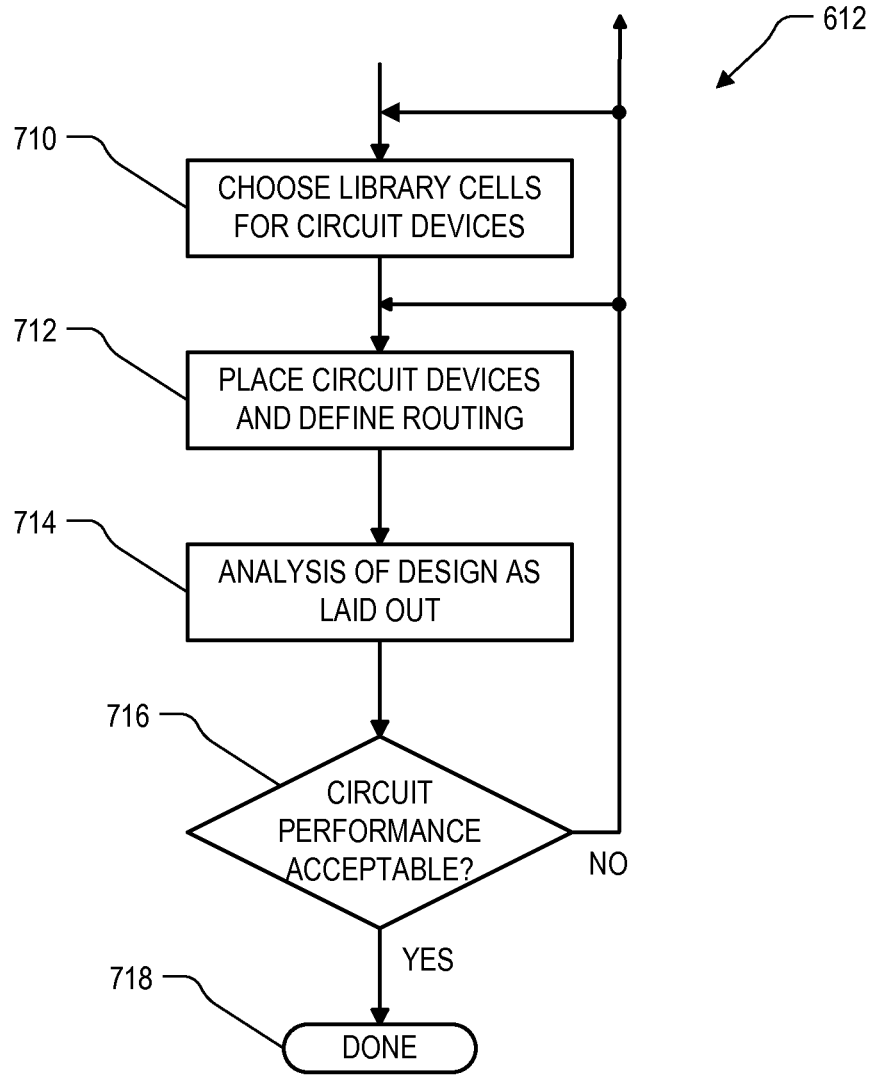
FIG. 7 is a flow chart detail of the step in FIG. 6 for laying out the circuit.

FIG. 7 is a flow chart detail of step 612 for laying out the circuit. FIG. 7 is a simplification of a highly involved process, most details of which are not important to an understanding of the invention and are not shown in the figure. Referring to FIG. 7, in step 710, library cells are chosen for the individual circuit devices specified in the incoming netlist. The library cells include (among other things) the layout geometries needed for the device, including an arrangement of transistor diffusion regions, gate stack(s), antenna diodes, TSVs, and doped regions such as 316 (FIGS. 3, 4 and 5). In one embodiment, the library includes cells that contain both a TSV and a nearby doped region 316 as described elsewhere herein. In a second embodiment, it does not.

In step 712, the library cells are placed into the layout and wires are defined to interconnect them in the interconnect layers, according to the circuit design. Numerous factors are taken into account in this step, most of which are not important to an understanding of the invention. In accordance with an aspect of the invention, however, this step includes defining a conductor in M1 that interconnects a TSV, a region 316, and the gate, source or drain of a transistor as described elsewhere herein. In one embodiment, the layout process includes identifying a position on the integrated circuit at which a TSV is to be placed, and determining an exclusion zone surrounding the TSV laterally. The exclusion zone determined in this step can in one embodiment be a circle of fixed radius, such as 0.5 microns or 5 microns, centered at the center of the TSV. Alternatively, the exclusion zone can be determined by reference to the relationships reported by Vandevelde or by any other reference source, for the particular substrate doping concentration and TSV size to be used in the integrated circuit. As yet another alternative, the exclusion zone can be determined by analysis of the stress consequences of the TSV in the particular environment, and deriving a 5% mobility variation contour therefrom. Many other methods can be used to determine the exclusion zone.

After the exclusion zone is determined, all of the transistors in the circuit are laid out in such a way that all of their diffusion regions lie outside the exclusion zone. An N+ region such as 316 is also laid out at least partially inside the exclusion zone, and an M1 layer interconnect is laid out which interconnects the TSV, the region 316, and either the gate conductor or one of the diffusion regions of one of the transistors.

The layout step 612 is highly iterative. Therefore, in step 714 the circuit as laid out is analyzed for chip area used, timing, power dissipation, and many other factors, and in step 716 it is determined whether the circuit performance is acceptable as laid out. If not, then the process returns to step 712 to try a different placement or routing of circuit devices (including reconsidering the source/drain choices and split diffusions from the previous iteration), or to step 710 to choose different library cells for circuit devices if necessary, or if necessary the process can even return to step 610 (FIG. 6) to modify the design of the circuit in some way. After step 716 determines that circuit performance is acceptable, the layout step 612 is done (step 718).

Figure 8:
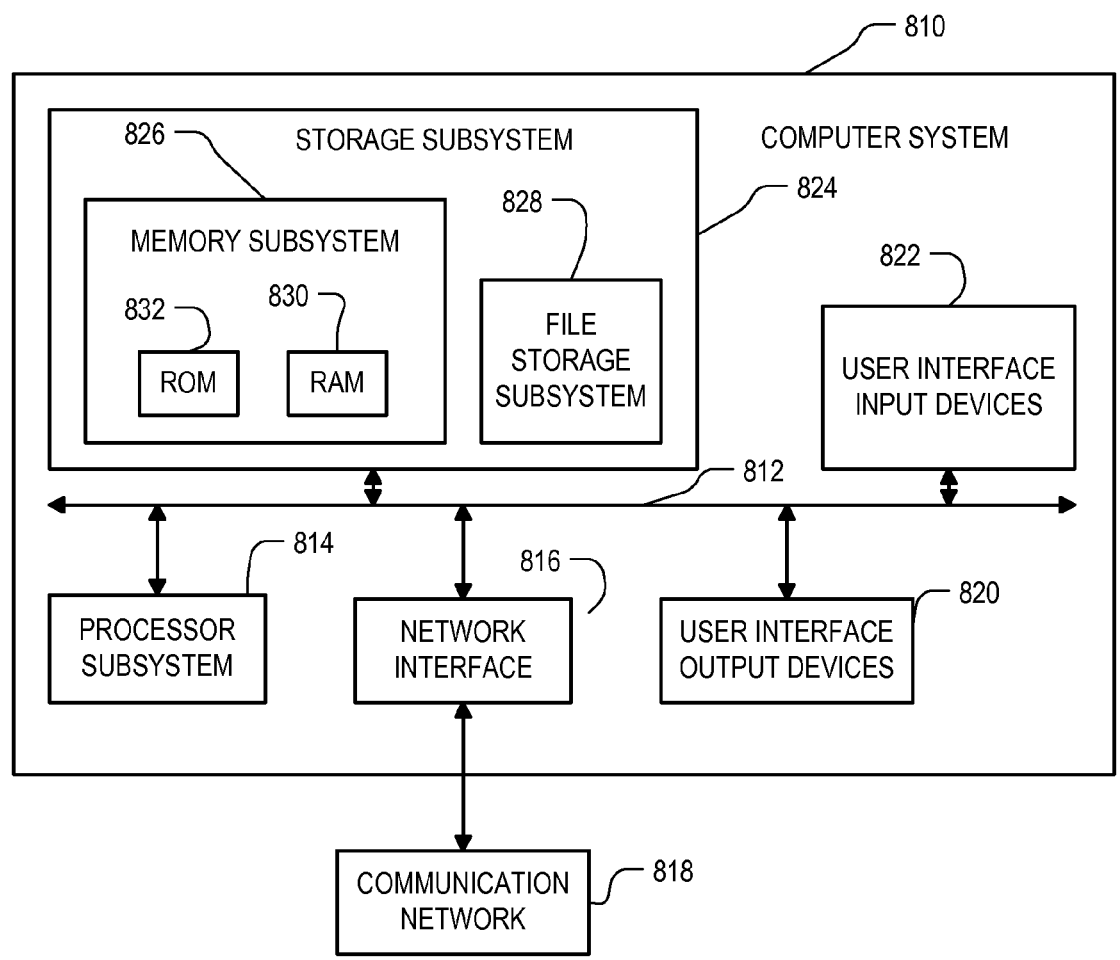
FIG. 8 is a simplified block diagram of a computer system that can be used to implement software incorporating aspects of the present invention.

FIG. 8 is a simplified block diagram of a computer system 810 that can be used to implement software incorporating aspects of the present invention. Computer system 810 includes a processor subsystem 814 which communicates with a number of peripheral devices via bus subsystem 812. These peripheral devices may include a storage subsystem 824, comprising a memory subsystem 826 and a file storage subsystem 828, user interface input devices 822, user interface output devices 820, and a network interface subsystem 816. The input and output devices allow user interaction with computer system 810. Network interface subsystem 816 provides an interface to outside networks, including an interface to communication network 818, and is coupled via communication network 818 to corresponding interface devices in other computer systems. Communication network 818 may comprise many interconnected computer systems and communication links. These communication links may be wireline links, optical links, wireless links, or any other mechanisms for communication of information. While in one embodiment, communication network 818 is the Internet, in other embodiments, communication network 818 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 822 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 810 or onto computer network 818.

User interface output devices 820 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 810 to the user or to another machine or computer system.

Storage subsystem 824 stores the basic programming and data constructs that provide the functionality of certain embodiments of the present invention. For example, the various modules implementing the functionality of certain embodiments of the invention may be stored in storage subsystem 824. These software modules are generally executed by processor subsystem 814.

Memory subsystem 826 typically includes a number of memories including a main random access memory (RAM) 830 for storage of instructions and data during program execution and a read only memory (ROM) 832 in which fixed instructions are stored. File storage subsystem 828 provides persistent storage for program and data files, and may include a hard disk drive, a floppy disk drive along with associated removable media, a CD-ROM drive, an optical drive, or removable media cartridges. The databases and modules implementing the functionality of certain embodiments of the invention may be stored by file storage subsystem 828. The host memory 826 contains, among other things, computer instructions which, when executed by the processor subsystem 814, cause the computer system to operate or perform functions as described herein. As used herein, processes and software that are said to run in or on "the host" or "the computer system", execute on the processor subsystem 814 in response to computer instructions and data in the host memory subsystem 826 including any other local or remote storage for such instructions and data.

Bus subsystem 812 provides a mechanism for letting the various components and subsystems of computer system 810 communicate with each other as intended. Although bus subsystem 812 is shown schematically as a single bus, alternative embodiments of the bus subsystem may use multiple busses.

Computer system 810 itself can be of varying types including a personal computer, a portable computer, a workstation, a computer terminal, a network computer, a television, a mainframe, or any other data processing system or user device. Due to the ever-changing nature of computers and networks, the description of computer system 810 depicted in FIG. 8 is intended only as a specific example for purposes of illustrating certain embodiments of the present invention. Many other configurations of computer system 810 are possible having more or less components than the computer system depicted in FIG. 8.

Though the steps set forth in FIGS. 6 and 7 can be performed by hand for certain kinds of circuits, in an embodiment they are performed by a computer system having a processor such as processor subsystem 814 and a memory such as storage subsystem 824, under the control of software which includes instructions which are executable by the processor subsystem 814 to perform the steps shown. The software also includes data on which the processor operates. The software is stored on a computer readable medium, which as used herein, is one on which information can be stored and read by a computer system. Examples include a floppy disk, a hard disk drive, a RAM, a CD, a DVD, flash memory, a USB drive, and so on. The computer readable medium may store information in coded formats that are decoded for actual use in a particular data processing system. A single computer readable medium, as the term is used herein, may also include more than one physical item, such as a plurality of CD-ROMs or a plurality of segments of RAM, or a combination of several different kinds of media. When the computer readable medium storing the software is combined with the computer system of FIG. 8, the combination is a machine which performs the steps set forth herein. Means for performing each step consists of the computer system (or only those parts of it that are needed for the step) in combination with software modules for performing the step. The computer readable medium storing the software is also capable of being distributed separately from the computer system, and forms its own article of manufacture.

Additionally, the netlist file or files containing a representation of the circuit design, and the geometry file or files storing the layouts, both after step 612 and after step 614, are themselves stored on computer readable media. Such media are distributable separately from the computer system, and form their own respective articles of manufacture. When combined with a computer system programmed with software for reading, revising and writing the netlist or geometry files they form yet another machine which performs the steps set forth herein.

Fabrication Processes

FIGS. 9A-9D are fabrication diagrams illustrating a method by which a device according to the invention can be fabricated. This is only one example, and it will be understood that numerous variations are possible within the level of ordinary skill. Also, many details and whole steps which would be apparent to a person of ordinary skill, and which are not important to an understanding of the invention, have been omitted for simplicity.

Figure 9A:
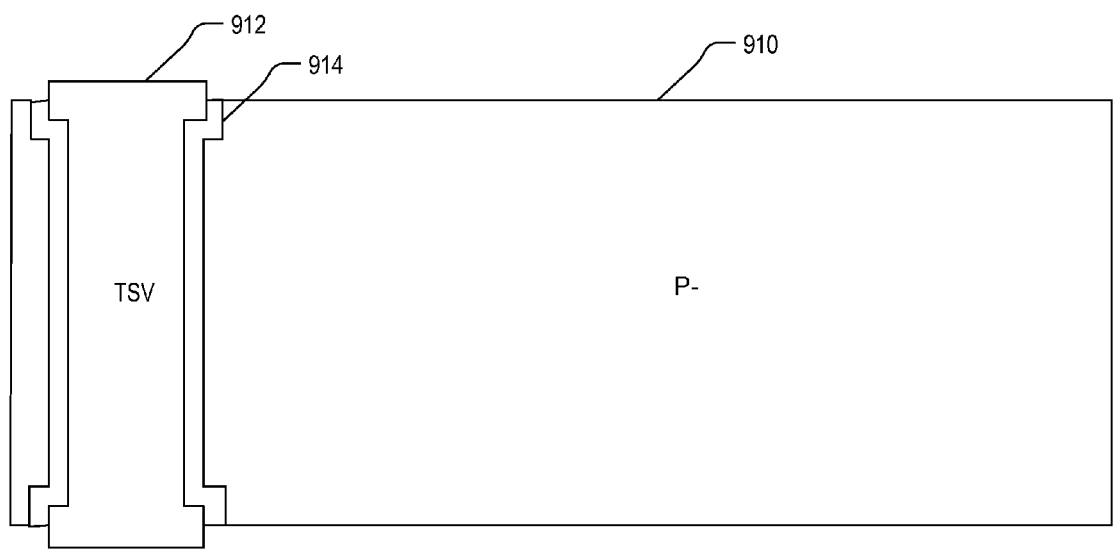
FIGS. 9A-9D are fabrication diagrams illustrating a method by which a device according to the invention can be fabricated.

FIG. 9A illustrates a cross-section of a P⁻ doped wafer region 910. The hole for a TSV 912 has been drilled through the wafer, the hole has been lined with an insulating barrier 914, and the TSV conductor has been formed in the hole.

Figure 9B:
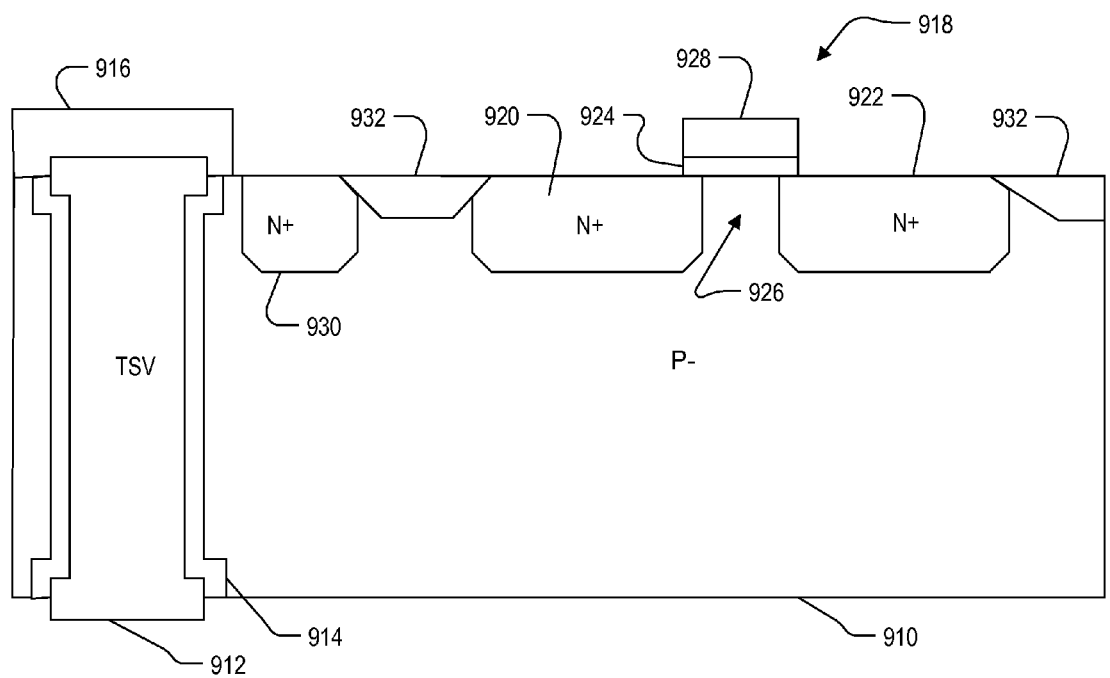

After the TSV 912 has been formed, as shown in FIG. 9B, an area 916 may be formed covering the TSV 912 as well as other regions of the wafer surface, for later integration. Active devices such as transistor 918 are then formed in the wafer region 910. Transistor 918 includes N⁺ source and drain regions 920 and 922, a gate dielectric material 924 above the channel 926, and a polysilicon gate conductor 928 above the gate dielectric material 924. The transistor is bounded laterally by STI regions 932. Also shown next to the TSV 912 is an N⁺ region 930 which forms the antenna diode with the P⁻ substrate 910. Importantly, although not required, the N⁻ region 930 may be formed in the same process step as the N⁺ source and drain regions 920 and 922 of the transistor 918. No additional process step is required to form N⁻ region 930.

Figure 9C:
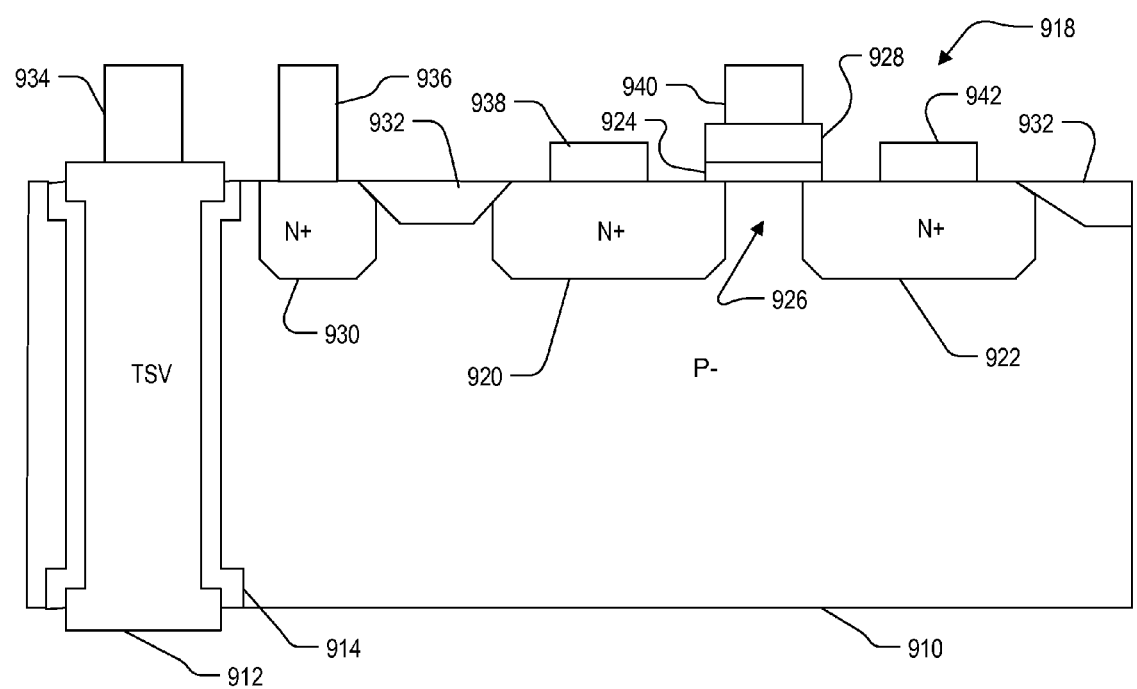

After the N⁺ regions 920, 922 and 930 have been formed, and the gate poly 928 has been formed, a dielectric layer is formed over the region and vias are etched therein as shown in FIG. 9C. A via 934 is shown exposing the TSV 912, a via 936 is shown exposing the N⁺ region 930, vias 938 and 942 are shown exposing the source and drain regions 920 and 922, and a via 940 is shown exposing the gate electrode 928. Importantly, although not required, the via 936 to the N⁺ region 930 can be etched in the same process step as any or all the other vias 934, 938, 940 and 942. No additional process step is required to etch a via to the N⁺ region 930.

Figure 9D:
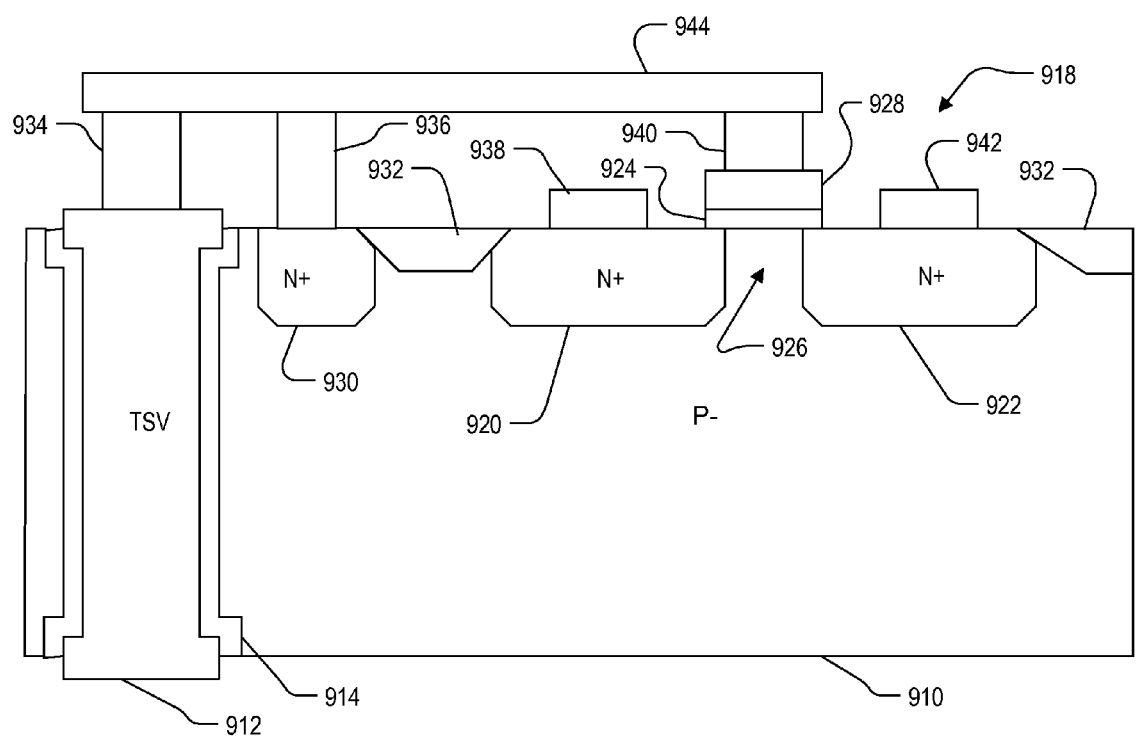

After the vias have been etched, as shown in FIG. 9D, they are filled and the first metal layer M1 is formed and etched. M1 layer conductor 944 is shown in FIG. 9D, and it can be seen that it connects the TSV 912 to the gate poly 928. The N⁻ region 930 is also connected to the conductor 944 at the same time. Other M1 layer conductors may also connect to the source and drain regions 920 and 922, but for clarity of illustration these are not shown in FIG. 9D.

It can be seen that the TSV 912 is connected to the antenna diode formed by N⁺ region 930 in the same process step that it is connected to the transistor gate poly 928, thereby protecting the gate dielectric 924 from charge pick-up by the TSV 912 during fabrication of the device. The same sequence of FIGS. 9A-9D can be used where M1 layer conductor 944 connects to the source or drain region 920 or 922, rather than to gate poly 928, in order to protect the gate dielectric 924 from ESD picked up by the TSV 912 during fabrication.

As used herein, layers which are termed "above" or "below" other layers, can in various embodiments be separated from such other layers by one or more intervening layers. The same interpretation is intended for layers being described as "superposing", "underlying", "overlying", "under" or "over" another layer, or "between" or "separating" two layers. Immediate adjacency is not required unless called for explicitly.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art, including all the configurations known as 'via early'. In particular, and without limitation, any and all variations described, suggested or incorporated by reference in the Background section of this patent application are specifically incorporated by reference into the description herein of embodiments of the invention. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method for laying out a circuit design, for use in forming a lithographic mask set for use in fabricating an integrated circuit on a substrate, the method being for use by a computer system having a processor and memory, the method comprising:

the computer system identifying a position on the integrated circuit at which a TSV is to be placed;

the computer system determining an exclusion zone surrounding the TSV laterally;

the computer system laying out a transistor having a diffusion region in the substrate, a gate conductor and a gate dielectric separating the gate conductor from the substrate, the diffusion region being disposed outside the exclusion zone;

the computer system laying out a first region in the substrate and at least partially within the exclusion zone, the first region being doped to exhibit a first conductivity type, the substrate in at least a second region adjacent to the first region being doped to exhibit a second conductivity type opposite the first conductivity type; and the computer system laying out an M1 layer conductor interconnecting the TSV, the first region, and a member of the group consisting of the diffusion region and the gate conductor.

2. The method of claim 1, wherein the M1 layer conductor interconnects the TSV, the first region, and the gate conductor.

3. The method of claim 1, wherein the M1 layer conductor interconnects the TSV, the first region, and the diffusion region.

4. The method of claim 1, wherein the first region surrounds the TSV laterally.

5. The method of claim 1, wherein the first conductivity type is N and the second conductivity type is P.

6. The method of claim 1, wherein the first region is disposed entirely within the exclusion zone.

7. A method for laying out a circuit design, for use in forming a lithographic mask set for use in fabricating an integrated circuit on a substrate, the method being for use by a computer system having a processor and memory, the method comprising:
- the computer system identifying a position on the integrated circuit at which a TSV is to be placed;
- the computer system laying out a particular transistor having a diffusion region in the substrate, a gate conductor and a gate dielectric separating the gate conductor from the substrate, the diffusion region being disposed entirely beyond 0.5 microns from the TSV;
- the computer system laying out a first region in the substrate and at least partially within 0.5 micron from the TSV, the first region being doped to exhibit a first conductivity type, the substrate in at least a second region adjacent to the first region being doped to exhibit a second conductivity type opposite the first conductivity type; and
- the computer system laying out an M1 layer conductor interconnecting the TSV, the first region, and a member of the group consisting of the diffusion region and the gate conductor.

8. The method of claim 7, wherein the M1 layer conductor interconnects the TSV, the first region, and the gate conductor.

9. The method of claim 7, wherein the M1 layer conductor interconnects the TSV, the first region, and the diffusion region.

10. The method of claim 7, wherein the first region surrounds the TSV laterally.

11. The method of claim 7, wherein the first region is disposed entirely within 0.5 micron from the TSV.

12. The method of claim 7, comprising the computer system laying out a plurality of transistors on the substrate, each having a diffusion region, the plurality of transistors including the particular transistor,
- wherein the first region is distinct from all the diffusion regions of all the transistors on the substrate,
- and wherein the layout is such that the point of the first region which is nearest the TSV is closer to the TSV than the nearest point to the TSV of the diffusion regions of all of the transistors on the substrate.

13. A method for laying out a circuit design, for use in forming a lithographic mask set for use in fabricating an integrated circuit on a substrate, the method being for use by a computer system having a processor and memory, the method comprising:
- the computer system identifying a position on the integrated circuit at which a TSV is to be placed;
- the computer system laying out a transistor having a diffusion region in the substrate, a gate conductor and a gate dielectric separating the gate conductor from the substrate, the diffusion region being disposed in the substrate;
- the computer system laying out a first region disposed in the substrate and surrounding the TSV laterally, the first region being doped to exhibit a first conductivity type, the substrate in at least a second region adjacent to the first region being doped to exhibit a second conductivity type opposite the first conductivity type; and
- the computer system laying out an M1 layer conductor interconnecting the TSV, the first region, and a member of the group consisting of the diffusion region and the gate conductor.

14. The method of claim 13, wherein the M1 layer conductor interconnects the TSV, the first region, and the gate conductor.

15. The method of claim 13, wherein the M1 layer conductor interconnects the TSV, the first region, and the diffusion region.

16. The method of claim 13, wherein the TSV has an associated exclusion zone,
- and wherein the first region is disposed entirely within the exclusion zone.

17. A method for laying out a circuit design, for use in forming a lithographic mask set for use in fabricating an integrated circuit on a substrate, the method being for use by a computer system having a processor and memory, the method comprising:
- the computer system identifying a position on the integrated circuit at which a TSV is to be placed;
- the computer system laying out a plurality of transistors on the substrate, each having first and second diffusion regions, a gate dielectric and a gate conductor overlying the gate dielectric, the plurality of transistors including a particular transistor having a particular diffusion region, a particular gate dielectric and a particular gate conductor overlying the particular gate dielectric;
- the computer system laying out a subject region distinct from all the diffusion regions of all the transistors on the substrate, the subject region being doped to exhibit a first conductivity type, the substrate in at least a second region adjacent to the subject region being doped to exhibit a second conductivity type opposite the first conductivity type; and
- the computer system laying out an M1 layer conductor interconnecting the TSV, the subject region, and a member of the group consisting of the particular diffusion region and the gate conductor,
- wherein the layout is such that the point of the subject region which is nearest the TSV is closer to the TSV than the nearest point to the TSV of the diffusion regions of all of the transistors on the substrate.

18. The method of claim 17, wherein the layout is such that the entire subject region is closer to the TSV than the nearest point to the TSV of the diffusion regions of all of the transistors on the substrate.

19. The method of claim 17, wherein the M1 layer conductor interconnects the TSV, the subject region, and the gate conductor.

20. The method of claim 17, wherein the M1 layer conductor interconnects the TSV, the subject region, and the diffusion region.

21. The method of claim 17, wherein the first conductivity type is N and the second conductivity type is P.

22. The method of claim 17, wherein the subject region surrounds the TSV laterally.

23. The method of claim 22, wherein the subject region is disposed at least partly within 0.5 microns from the TSV.

24. A method for laying out a circuit design, for use in forming a lithographic mask set for use in fabricating an integrated circuit on a substrate, the method being for use by a computer system having a processor and memory, the method comprising:
- the computer system identifying a position on the integrated circuit at which a TSV is to be placed in response to circuit design data;
- the computer system laying out a transistor and a gate conductor;
- the computer system laying out a first region laterally proximate to the TSV; and
- the computer system laying out an M1 layer conductor interconnecting the TSV, the first region, and a member of the group consisting of the transistor and the gate conductor wherein the first region is inside an exclusion zone of the TSV and the transistor and the gate are outside the exclusion zone.

* * * * *